United States Patent [19]
De Petro et al.

[11] Patent Number: 6,093,588
[45] Date of Patent: Jul. 25, 2000

[54] PROCESS FOR FABRICATING A HIGH VOLTAGE MOSFET

[75] Inventors: Riccardo De Petro, Domodossola; Paola Galbiati, Monza; Michele Palmieri, Bitonto; Claudio Contiero, Buccinasco, all of Italy

[73] Assignee: STMicroelectronics, S.r.l., Agrate Brianza, Italy

[21] Appl. No.: 09/018,410

[22] Filed: Feb. 4, 1998

Related U.S. Application Data

[62] Division of application No. 08/604,164, Feb. 21, 1996.

[30] Foreign Application Priority Data

Feb. 21, 1995 [EP] European Pat. Off. ............. 95830045

[51] Int. Cl.[7] .................................................. H01L 29/72
[52] U.S. Cl. ......................... 438/180; 438/225; 438/297; 438/294; 438/229; 438/514; 257/333; 257/341
[58] Field of Search .................................. 257/333, 341; 438/180, 225, 229, 294, 297, 514

[56] References Cited

U.S. PATENT DOCUMENTS

| | | | |
|---|---|---|---|
| 3,685,140 | 8/1972 | Engeler | 29/571 |
| 3,863,330 | 2/1975 | Kraybill et al. | 29/571 |
| 4,209,716 | 6/1980 | Raymond, Jr. | 357/59 |
| 4,333,225 | 6/1982 | Yeh | 29/571 |
| 5,159,425 | 10/1992 | Zommer | 357/39 |
| 5,258,636 | 11/1993 | Rumennik et al. | 257/339 |
| 5,404,040 | 4/1995 | Hshieh et al. | 257/341 |
| 5,430,316 | 7/1995 | Contiero et al. | 257/335 |
| 5,585,657 | 12/1996 | Efland et al. | 257/335 |
| 5,585,660 | 12/1996 | Mei | 257/389 |
| 5,592,026 | 1/1997 | Frisina et al. | 257/786 |
| 5,723,893 | 3/1998 | Chen-Hua et al. | 438/180 |

FOREIGN PATENT DOCUMENTS

| | | | |
|---|---|---|---|
| 0 098 652 | 1/1984 | European Pat. Off. | H01L 21/28 |
| 0 294 888 A3 | 12/1988 | European Pat. Off. | H01L 29/78 |
| 0 487 022 A2 | 5/1992 | European Pat. Off. | H01L 29/784 |
| 38 16 002 A1 | 12/1988 | Germany | H01L 29/78 |
| 61-248565 | 11/1986 | Japan | H01L 29/78 |
| WO 91/11826 | 8/1991 | WIPO | 257/341 |

*Primary Examiner*—Edward Wojciechowicz
*Attorney, Agent, or Firm*—David V. Carlson; Kevin S. Ross; Seed and Berry LLP

[57] ABSTRACT

A high-voltage lateral MOSFET transistor structure constituted by various interdigitated modular elements formed on a layer of monocrystaline silicon is described together with a process for its fabrication.

To save area of silicon and to reduce the specific resistivity RDS on doping drain regions are formed by implanting doping material in the silicon through apertures in the field oxide obtained with a selective anisotropic etching by utilizing as a mask the strips of polycrystaline silicon which serve as gate electrodes and field electrodes.

15 Claims, 3 Drawing Sheets

PROCESS FOR FABRICATING A HIGH VOLTAGE MOSFET

CROSS-REFERENCE TO RELATED APPLICATION

This application is a Divisional Application of U.S. patent application Ser. No. 08/604,164, filed Feb. 21, 1996.

TECHNICAL FIELD

The present invention relates to semiconductor devices, and more particularly, to a high-voltage MOSFET transistor structure and a process for making such structure.

BACKGROUND OF THE INVENTION

Many complex integrated circuits make use of lateral double diffused MOSFET transistors capable of supporting relatively high voltages (40–60V) (LDMOS: lateral double diffused metal oxide semiconductor) both of N-channel and P-channel type, and P channel vertical MOSFET transistors, again for relatively high voltages. By way of example, in FIG. 1 of the attached drawings is shown a schematic partial section of an N-channel LDMOS transistor structure according to the prior art. This transistor is formed on an epitaxial layer of N-type 1, formed, in turn, on a P-type monocrystalline silicon substrate, not shown, and has an interdigitate geometry, that is to say, it is composed of copenetrating modular functional elements. In the drawing, there are shown two source elements and one drain element, with their associated gate electrodes.

More particularly, the structure of FIG. 1 comprises insulating elements 2 in the form of lands of relatively thick silicon dioxide, for example 1 μm, obtained by a known insulating technique by selective oxidation of the silicon with a silicon nitride mask. The insulating elements 2 separate silicon surfaces between them, the so-called active areas. In alternate active areas are formed P-type regions 3, the so-called "body" regions of the transistor, within which are formed respective source regions 4 of strongly doped N-type (N+).

The source regions 4 are traversed by strongly doped P-type regions 5 (P+) which serve to contact the body regions 3.

Suitable metal strips 6 in ohmic contact with the regions 4 and 5 are joined together to form the source terminal S of the transistor.

In the active areas between each two source elements, the epitaxial layer 1 is locally doped with N-type doping material in such a way as to form strongly doped N-type regions 7 (N+) which, together with the zones of the epitaxial layer 1 adjacent to it, constitute the elementary drain regions.

Metal strips 61 are also formed on these regions, only one of which is visible in FIG. 1, in ohmic contact and joined together to form the drain terminal D of the transistor.

The edge zones of the body region 3, which constitute the channel zones of the transistor, are overlain by relatively thin layers (for example 0.005 μm) of silicon dioxide 8. Over these layers and over edge portions of the insulating elements of field oxide 2 are formed layers of electroconductive material, for example, doped polycrystaline silicon 9, which are joined together to form the gate electrode G of the transistor.

The strips 9 also fulfill the function of field electrodes for the drain junctions, that is to say, for the junctions between the body regions 3 and the drain regions 7, 1. In operation of the transistor, these junctions are polarized in the inverse sense and the field electrode is normally at a potential, with respect to that of the drain, which has the effect of reducing the electric field of the junction in proximity to the silicon surface and thus of increasing the maximum breakdown voltage between source and drain of the transistor.

In order to reduce both the area occupied by the transistor and the series resistance of the transistor in direct conduction it is sought to reduce as much as possible the width of the insulating elements of field oxide 2. The minimum width of these elements is, however, set by various fabrication requirements. In particular, the minimum distance between the edge of the strip 9 and the extremity of the field oxide 2 closest to the drain region 7, indicated d1 in FIG. 1, is determined by the maximum possible alignment error with the photolithographic technique utilized and the minimum distance between the same edge and the other extremity of the field oxide 2 indicated d2 is determined by the maximum breakdown voltage which it is desired to obtain.

SUMMARY OF THE INVENTION

An object of the present invention is to provide a high-voltage MOSFET transistor structure which occupies a smaller area than that occupied by known structures, and a process for the fabrication of such a structure.

According to principles of the present invention, a high power MOS transistor structure having a plurality of source regions and a plurality of drain regions is formed in a semiconductor substrate. Each drain region includes a plurality of drain contact regions, each drain contact region having an enlarged topographical area. In between the drain contact regions, the drain region necks down to form a more narrow, heavily doped drain region. The drain contact regions are interdigited such that the neck down portion of one drain region is aligned with the enlarged contact area of the adjacent drain region to provide a more compact structure. The body region, channel region and source region follow the contours of the drain region to maintain a uniform space in between the source, channel and drain throughout the structure.

According to one embodiment of the present invention, the gate electrode acts as the masking layer for forming the body region. The channel region is subsequently formed within the body region. In subsequent processing steps, the same gate electrode layer is used as the masking layer for etching the field oxide to expose a portion of the substrate. In a subsequent processing step, the same gate electrode is used as the implant mask for implanting doping into the source and drain regions of the substrate. The use of the same gate electrode as the mask for the body region implant, the gate oxide etch, the field oxide etch, and the source drain implants provides the advantage of ensuring that all critical dimensions are self-aligned and accurately positioned with respect to each other. It also ensures that there are no gate-to-drain shorts throughout the circuit structure.

BRIEF DESCRIPTION OF THE DRAWINGS

The invention will be better understood from the following detailed description of an exemplary and therefore in no way limitative example in relation to the attached drawings, in which.

DETAILED DESCRIPTION OF THE INVENTION

Figure 1:
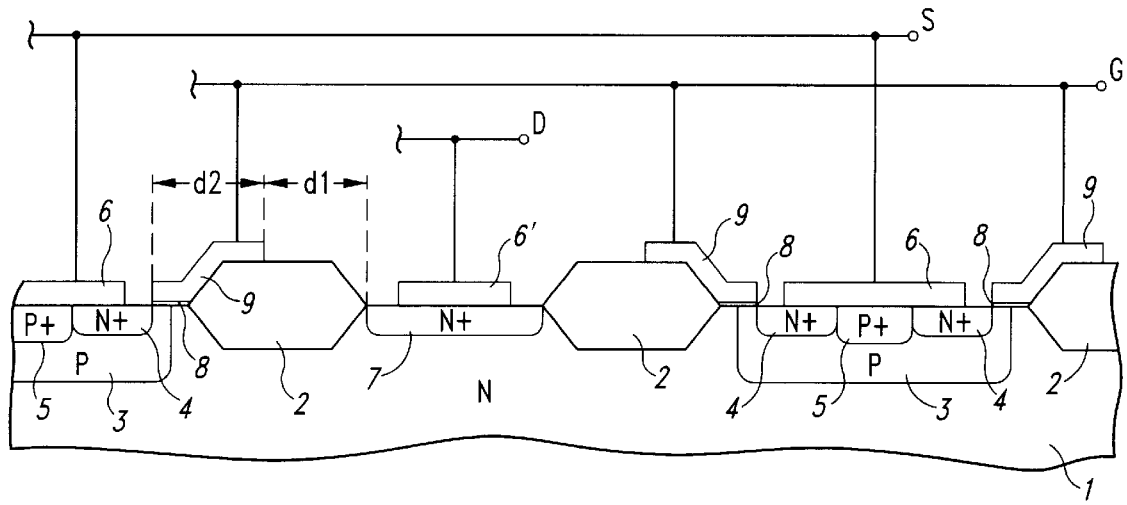
FIG. 1, already described, is a partial section of a known N-channel LDMOS transistor.

The principal stages of the process for the formation of a transistor structure according to the invention are described hereinbelow with reference to the drawings.

The concentrations of N-type and P-type impurities in the various regions are indicated, as is usual in the art, by adding the minus sign or plus sign to the letters N and P to denote fight or heavy doping concentrations, respectively. The letters N and P without a minus or plus sign denote concentrations of intermediate value.

A layer of (N–) monocrystaline silicon is formed, by epitaxial growing at high temperature on a P-type monocrystaline silicon substrate, not shown.

This layer is subdivided, by means of (P+) diffused regions, which extend in depth down to the substrate, not shown, in a multiplicity of portions, usually called "wells," insulated from one another, within which will be formed electronic components of various type, such as MOS power and signal transistors, bipolar power and signal transistors, diodes, memories, etc.

Relatively thick regions of silicon dioxide are formed by selective oxidation at high temperature with a silicon nitride mask to create a field oxide to isolate different regions within a well. The field oxide thus formed increases at the expense of the underlying silicon so that the top most surface of the silicon is sunken with respect to the original surface of the epitaxial layer 10. A part of one such well intended to contain a high-voltage lateral MOSFET transistor according to the invention, is shown in the drawings.

Figure 2A:
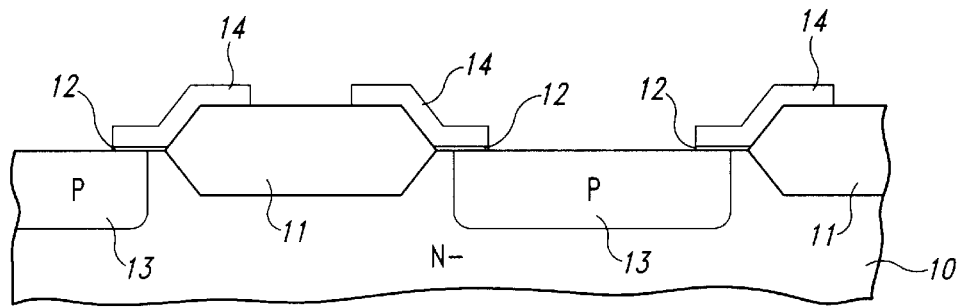
FIGS. 2A–2D are partial sections of a LDMOS transistor structure according to the invention in various stages of fabrication.

With reference particularly to FIG. 2A, two lands of field oxide 11 delimit active areas between them. These are covered by a thin layer of silicon dioxide, obtained by oxidation at high temperature of the silicon of the epitaxial layer 10. In the active areas are formed P-regions 13, intended to be the body regions of the transistor, which are formed by deposition, or implantation, and diffusion of a P-type doping material, for example, boron by utilizing a polycrystaline silicon layer 14 as a mask. The gate oxide 12 is formed and the polysilicon layer 14 is formed overlying the gate oxide. The layer 14 is deposited over the whole surface of the structure and then removed from the areas to be doped and from the areas of the field oxide to be etched. The poly layer 14 is thus the mask for the P implant that forms the body region and the channel region.

Before deposition of the doping material, or in one embodiment, after doping, the thin oxide layer 12 is removed from the same areas using the poly layer 14 as a mask and therefore remains only under the layer of polycrystaline silicon.

The residual thin oxide 12, and the overlying residual polycrystaline silicon in the form of strip 14, are intended to constitute, respectively, the gate dielectric and the gate electrode of the transistor. The polycrystaline silicon 14 is rendered conductive by doping during the subsequent formation stages.

As is shown in FIG. 2A, the strips of polycrystaline silicon 14 formed and etched also delimit apertures over the field oxide 11. Subsequent operations include anisotropic etching of the field oxide through the apertures of the polycrystaline silicon layer 14.

Preferably, this etching is effected by $CF_4/CHF_3$ plasma at a pressure of 300–400 mTorr and with a radio frequency power of 400–500 watt. More specifically, the polysilicon acts as the mask layer for the etching of the field oxide to provide the drain region as explained later herein and for the doping of the body region 13. A single photoresist and mask operation thus provide the alignment of the regions to form the source/drain regions and the body regions as explained later herein.

Figure 2B:
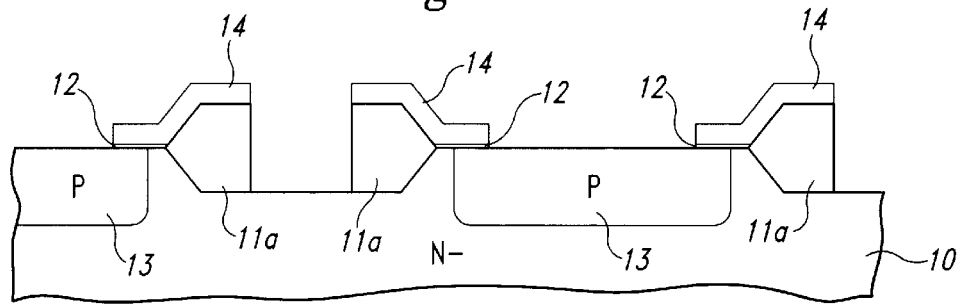

This etching has a high selectivity with respect to the silicon, that is to say, a much greater speed of attack on the silicon dioxide than that on the silicon, both polycrystaline and monocrystaline. There is thus obtained the structure represented in FIG. 2B, in which it is seen that the land 11 has been divided into two parts 11a which constitute two separate insulating elements. The process used departs at this point from the standard locos process. As will be seen, there is no bird's beak and associated problems adjacent the drain region 16. The drain is self-aligned to the gate electrode because the gate electrode was used as a mask to etch the field oxide for formation of the drain region. Therefore, gate-to-drain shorts are avoided, a common problem in the prior art devices.

Figure 2C:
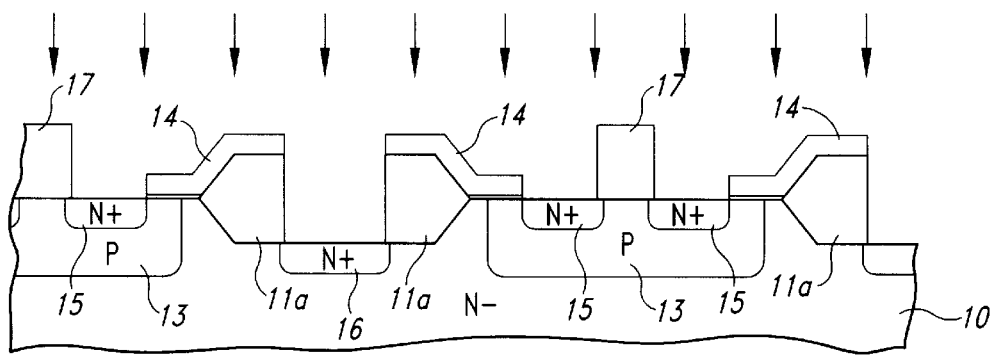

The surface of the structure under formation is then subjected to ionic implantation, indicated with arrows in FIG. 2C, with an N-type doping material, for example arsenic, after having masked the central parts of the surfaces of the P-body regions 13 with a photoresist 17.

During a subsequent heating phase two (N+) regions 15 are formed in the body regions which together form the source region of the transistor. The doping through the oxide to form a portion of the drain region 16 which constitutes a local heavy doping above the level of doping of the epitaxial layer 10, form the drain region of the transistor. More precisely, the drain region also extends in part into the epitaxial layer 10 and then laterally to the more heavily doped (N+) regions 16 up to the P-body regions. The drain region is in fact formed of the entire epitaxial layer 10 between the body regions 13.

As is seen, the strips of polycrystaline silicon 14, the insulating elements 11a and the heavily doped portions of the drain regions 16 have substantially aligned edges. Moreover, the same mask formed by the strips of the polycrystaline silicon 14 was used for all three edges to ensure automatic alignment both of the source regions 15 and the doped drain regions 16, with the advantage of a great compactness of the structure and a high uniformity of the electrical characteristics of the modular elements forming the transistor. In one embodiment, the same masking layer 14 was also used to align the body region 13, thus ensuring automatic alignment of the body with the source and drain.

Figure 2D:
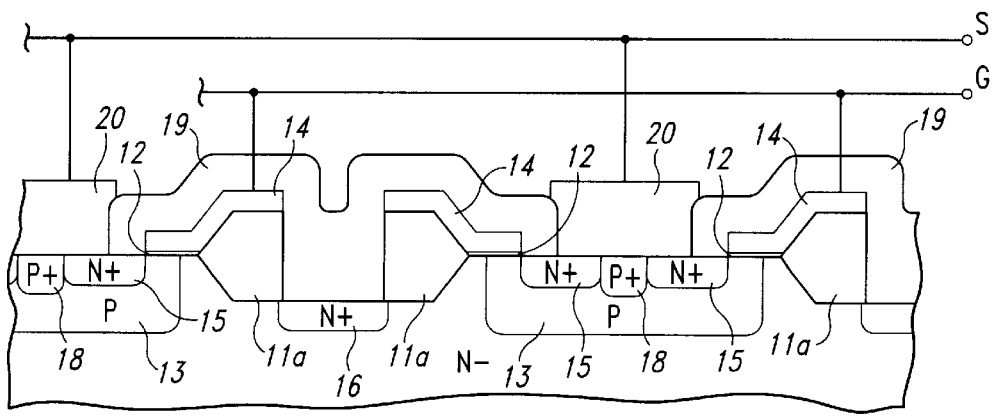

After removal of the photoresist mask 17 known techniques are used to form the (P+) regions 18 in FIG. 2D which regions serve to contact the body regions 13; to deposit a layer of passivating and insulating silicon dioxide 19; to open windows in this layer 19 for the formation of metal interconnections, for example, of aluminum; to connect the source regions electrically together and to the source terminal S, the drain regions together and to the drain terminal D, and the gate electrodes together and to the gate terminal G of the transistor. In FIG. 2D only the metal source interconnection layer 20 for the source and body for one contact is shown, being in ohmic contact with the regions 15 and 18. The interconnection of the other source elements are represented by schematic electrical connection lines, as also are the gate interconnection tracks.

Figure 4A:
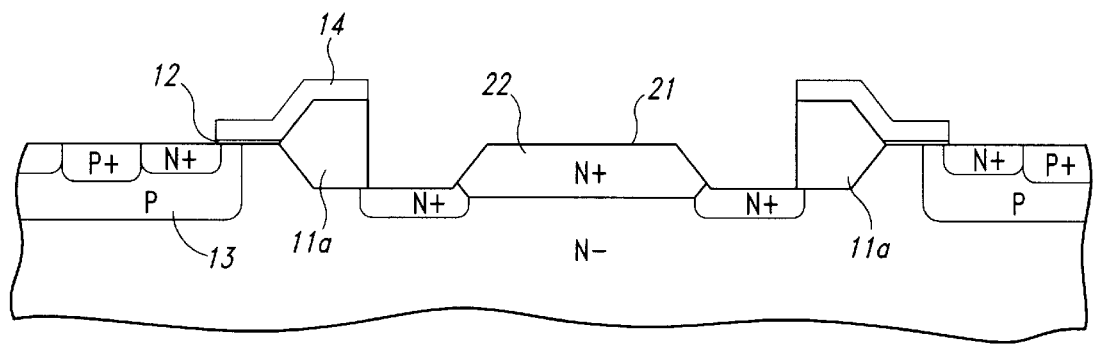
FIG. 4A is a partial section of the structure according to the invention taken on the line IV—IV of FIG. 3.
Figure 4B:
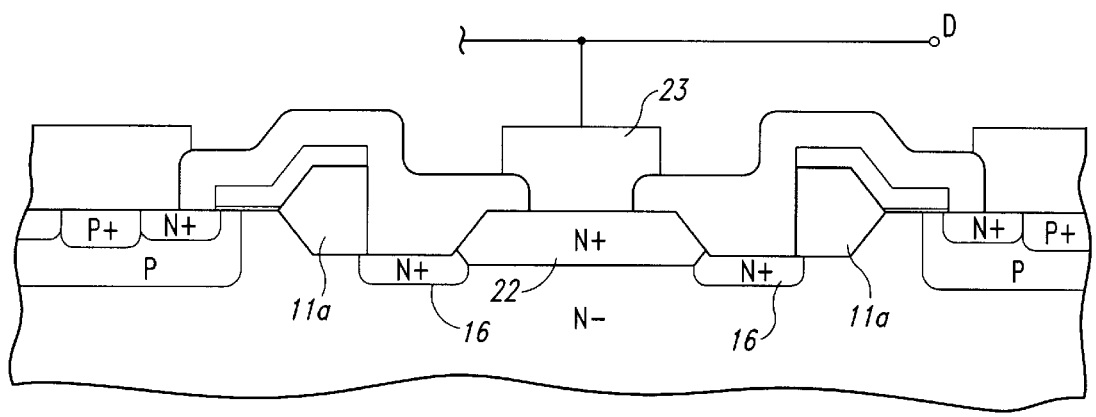
FIG. 4B is a partial section of the structure according to the invention in a subsequent stage to that shown in FIG. 4A.
Figure 3:
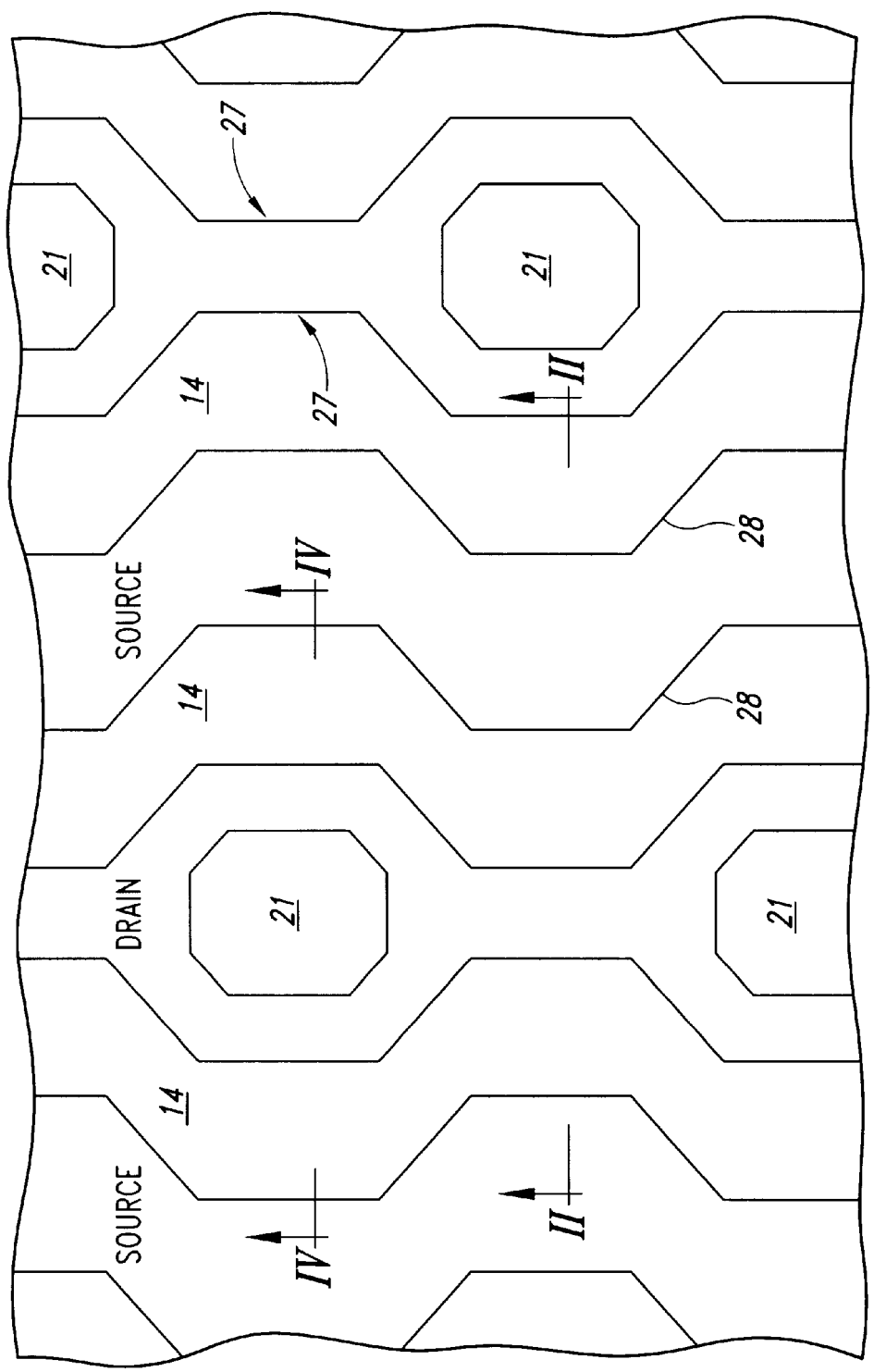
FIG. 3 is a partial plan view of a structure according to the invention, constituted by a plurality of modular elements, in a fabrication stage immediately preceding that of FIG. 2D.

The drain interconnections and contacts are shown in the plan view of FIG. 3 and the section views of FIGS. 4A and 4B. In FIG. 3 the lines II—II and IV—IV indicate two section lines of the structure in the fabrication stage immediately preceding that of deposition of the passivation layer 19. FIG. 2C is taken approximately along lines II—II, while FIG. 4A is taken along lines IV—IV.

As is seen in FIG. 4b, which represents the structure according to the invention in the fabrication stage of FIG. 2D, the drain contact of each transistor element occupies an active area 21 in FIGS. 3, 4A and 4B, from which the original insulation of field oxide has been removed in the selective and anisotropic etching phase described above, and strongly doped with an N-type doping in such a way as to form an (N+) region 22 in FIGS. 4A and 4B in contact with the (N+) regions 16. As will be appreciated, the area 21 is a raised area, similar to the area that formed the body region 13. It is raised because it was not consumed when the field oxide 11 was formed. When the field oxide was etched, the oxide portion adjacent the raised area 21 was etched, leaving the sloped edges on area 21 as a reside of the bird's beak.

A metal contact 23 in ohmic contact with the (N+) region 22 forms the drain terminal of the transistor element and is connected to the other elements toconstitute the drain terminal D.

From a comparison with the known structure of FIG. 1, it can easily be established that the high-voltage lateral MOSFET transistor structure according to the invention occupies a much smaller area in that the (N+) more heavily doped drain regions 16 do not require a suitable active area as in the case of the known structure, and the field oxide portions which, in the prior art extended for a distance d1 over both the sides of the (N+) doped regions 7 are entirely missing in the new structure. In practice, the saving of area can be up to 20%.

One important advantage in this connection is that the reduction of the dimensions of the field oxide does not compromise the voltage barrier between source and drain. It also provides significant advantages in terms of electrical characteristics of the transistor.

More particularly, as has already been mentioned, it has been established that the field electrode function performed by the polycrystaline silicon strips 14 as well as that of the gate electrode remain unaltered because they do not depend on the lateral extent of the field oxide but only on the distance between the edge of the part overlying the field oxide from the edge of the (N+) doped drain region. This distance, according to the invention, is not reduced because the thickness of the field oxide is normally at least equal to the lateral dimension d1 which, as has already been mentioned, was set only by the photolithographic tolerances. This result, in the example described, is also encouraged by the fact that, with the insulating technique by means of selective oxidation of the silicon with a silicon nitride mask, the (N+) doped regions 16 extend from a lower level than the surface of the epitaxial layer 10. Namely, the source region and more heavily doped drain regions 16 are at different vertical levels. The drain contact region 21 is at a higher vertical level in one embodiment, though this is not required in all embodiments of the invention. In one embodiment, the contact region 21 and heavily doped drain region 16 are at the same vertical level.

In the present invention, a drain contact 21 is positioned only as needed with subsequent significant savings in area. The drain region necks down as shown at 27 to reduce the area required for the drain where no contact is present. The amount of source-channel-drain contact area is much enlarged over the prior art by the angled contours 28 as the drain necks down and then enlarges at the contacts. The source and channel follow the contours of the drain to maintain a uniform and even spacing throughout the power transistor. The increased area provides a higher current flow capability for a given resistance. Using the same mask layer for forming the channel region and then later for etching the field oxide and then for forming drain and source regions permit the device to be very compact and yet ensures proper operation.

As far as the electrical characteristics of the transistor are concerned, then, the dimensional reduction involves a considerable shortening of the path of the drain current in the epitaxial layer 10, which has a relatively high resistivity, and therefore a reduction in the resistance between source and drain per unit area with the transistor in direct conduction (specific resistance RDS on).

Although a number of embodiments of the invention have been described, it is clear that numerous variations and modifications are possible within the ambit of the same inventive concept. For example, with the process according to the invention a structure can be achieved entirely similar to that described for obtaining a P-channel rather than an N-channel lateral MOSFET transistor or to obtain a P-channel vertical MOSFET transistor.

We claim:

1. A process for the fabrication of a high-voltage MOSFET transistor on a layer of monocrystaline silicon which comprises the operations of:

forming a first region and a second region of the same conductivity type functioning, respectively, as source region and drain region separated by a region of opposite conductivity which includes a channel zone delimited by the front surface of the silicon layer, the second region forming with this region of opposite conductivity a junction delimited by the said front surface;

forming in the said second region a doped region delimited by the front surface;

forming a relatively thick insulating element of silicon dioxide on the front surface of the silicon layer between the channel zone and the doped region;

forming a relatively thin layer of silicon dioxide on the front surface over the channel zone functioning as gate dielectric;

forming a layer of electroconductive material over the relatively thin layer of silicon dioxide and over the relatively thick insulating element of silicon dioxide, functioning as gate electrode and field electrode for the said junction;

forming electrical connection means with the first region, the doped region and the strip of electroconductive material to form, respectively, the source terminals, drain terminals and gate terminals of the transistor, characterized in that the formation of the relatively thick insulating element of silicon dioxide envisages the following operations;

forming a land of relatively thick silicon dioxide over the front surface of the silicon layer;

forming a layer of electroconductive material which extends at least over the land;

selectively removing the layer of electroconductive material in such a way as to expose a part of the land and to obtain the said strip to form the gate electrode and field electrode; and performing a selective anisotropic etching of the silicon dioxide of the land utilizing the layer of electroconductive material as mask to expose the front surface and in that the formation of the doped region includes the introduction of doping material into the silicon layer through the part of the front surface exposed with the said selective anisotropic etching.

2. A process according to claim 1 in which the formation of a land of relatively thick silicon dioxide takes place by selective oxidation at high temperature with a mask of silicon nitride.

3. A process for fabricating a high-voltage MOSFET transistor on a monocrystaline silicon layer comprising the steps of:

forming field oxide regions separated by an active area adjacent the top surface of the silicon layer;

forming a gate oxide layer over the active area;

depositing a gate electrode over the gate oxide layer;

etching the gate electrode and gate oxide to expose a central portion of the active area;

forming a body region of a first conductivity type in the active area using the gate electrode as a doping mask;

etching a central portion of the thick field oxide regions to expose a surface of the silicon layer; and forming source and drain regions of a second conductivity type in the silicon layer using the same gate electrode as a doping mask for both the source and drain regions as was used for the doping mask of the body region.

4. The process of claim 3 wherein the forming step of the source and drain regions is proceeded by the steps comprising:

depositing a photoresist mask layer over the active area; and patterning the mask such that lateral regions of the active area between the gate electrode adjacent the body region and a central region of the active area is exposed.

5. The process of claim 3 wherein the forming step of the body region is followed by the steps comprising:

annealing the substrate, thereby diffusing the body region laterally and vertically into the substrate such that a deep body region is formed extending under a portion of the gate electrode and allowing the source and drain regions to be contained within the deep body region.

6. The process of claim 5 wherein the forming step of the source and drain region further includes annealing the substrate to increase the dopant concentration of the source and drain region of the second conductivity type and to develop an increased dopant concentration of a portion of the body region adjacent the substrate surface and between the annealed source regions.

7. The process of claim 4 wherein the patterning step of the photoresist mask is followed by the steps comprising:

removing the photoresist mask;

depositing a metal interconnection layer to the respective source, drain, and gate electrodes; and depositing a oxide passivation layer.

8. The process of claim 3 wherein the field oxide regions are etched by selective and anisotropic etching techniques.

9. The process of claim 3 wherein the gate electrode is doped polycrystaline silicon.

10. The process of claim 1 wherein the step of forming a gate oxide layer further includes the step of etching the gate oxide layer over the field oxide layer.

11. The process of claim 1 wherein the substrate is an epitaxial layer and the oxide layer is formed by oxidation.

12. A method of forming a semiconductor circuit, comprising:

forming a field oxide over a first region of a substrate;

forming a gate oxide over a channel region of the substrate, the gate oxide being adjacent and abutting the field oxide;

forming a gate electrode overlaying the gate oxide and also overlaying a first portion of the field oxide;

removing a second portion of the field oxide that is not overlaid by the gate electrode to expose a second portion of the substrate; and doping the substrate to form source regions adjacent the channel regions and a heavily doped drain region in the second portion of the substrate using the gate electrode as a masking layer.

13. The method according to claim 12 wherein the step of forming a gate electrode overlaying a first portion of the field oxide includes:

depositing a gate electrode over the entire field oxide; and etching away a portion of the gate electrode from the field oxide.

14. The method according to claim 13, further including using the gate electrode as an etch mask for removing the second portions of the field oxide.

15. The method according to claim 13, further including using a single photoresist mask as the etch mask for both the gate electrode and the field oxide.

* * * * *